United States Patent [19]

Granot

[11] Patent Number: 4,878,021

[45] Date of Patent: Oct. 31, 1989

[54] MAGNETIC RESONANCE SPECTROSCOPY STUDIES OF RESTRICTED VOLUMES

[75] Inventor: Joseph Granot, Holon, Israel

[73] Assignee: Elscint Ltd., Haifa, Israel

[21] Appl. No.: 256,403

[22] Filed: Oct. 11, 1988

[30] Foreign Application Priority Data

Oct. 12, 1987 [IL] Israel ........................................ 84152

[51] Int. Cl.$^4$ .............................................. G01R 33/20
[52] U.S. Cl. ...................................... 324/309; 324/307
[58] Field of Search ................ 324/300, 307, 309, 314, 324/310

[56] References Cited

U.S. PATENT DOCUMENTS

| | | | |
|---|---|---|---|
| 4,516,582 | 5/1985 | Redington | 324/309 |
| 4,532,473 | 7/1985 | Wehrli | 324/309 |
| 4,563,647 | 1/1986 | Young | 324/309 |
| 4,587,488 | 5/1986 | Young | 324/309 |
| 4,613,949 | 9/1986 | Glover | 324/309 |
| 4,683,432 | 7/1987 | Young | 324/309 |
| 4,733,183 | 3/1988 | Young | 324/309 |
| 4,771,242 | 9/1988 | Lampman | 324/309 |

OTHER PUBLICATIONS

Joseph Granot, COMMUNICATIONS: Selected Volume Excitation Using Stimulated Echoes (VEST). Applications to Spatially Localized Spectroscopy and Imaging, *Journal of Magnetic Resonance*, 70, 488–492 (1986).

Dietmar Kunz, "Frequency-Modulated Radiofrequency Pulses in Spin-Echo and Stimulated-Echo Experiments", *Magnetic Resonance in Medecene*, 4, 129–136 (1987).

Dietmar Kunz, "Use of Frequency-Modulated Radiofrequency Pulses in MR Imaging Experiments", *Magnetic Resonance in Medicine*, 3, 377–384 (1986).

M. Robin Bendall and David T. Pegg, "Comparison of Depth Pulse Sequences with Composite Pulses for Spatial Selection in in vitro NMR", *Journal of Magnetic Resonance*, 63, 494–503 (1985).

Raymond Damadian, Lawrence Minkoff, Michael Goldsmith, Michael Stanford and Jason Koutcher, "Field Focusing Nuclear Magnetic Resonance (FONAR): Visualization of a Tumor in a Live Animal", *Science*, Vol. 194, Dec. 24, 1976, pp. 1430–1432.

Katherine N. Scott, H. Ralph Brooker, Jeffrey R. Fitzsimmons, Harold F. Bennett, and Rodney C. Mich, "Spatial Localization of $^{31}$P Nuclear Magnetic Resonance Signal by the Sensitive Point Method", *Journal of Magnetic Resonance*, 50, 339–344 (1982).

R. E. Gordon and R. J. Ordidge, "Volume Selection for High Resolution NMR Studies", Oxford Research Systems Limited, pp. 272–273.

W. P. Aue, S. Muller, T. A. Cross, and J. Seelig, "Volume-Selective Excitation. A Novel Approach to Topical NMR", *Journal of Magnetic Resonance*, 56, 350–354 (1984).

Depth Pulse Sequences for Surface Coils: Spatial Localization and $T_1$ Measurements; by Thian C. NG, Jerry D. Glickson and M. Robin Bendall; Magnetic Resonance in Medicine 1, 450–462 (1984).

Primary Examiner—Michael J. Tokar
Attorney, Agent, or Firm—Sandler & Greenblum

[57] ABSTRACT

Methods and Apparatus using frequency modulated RF pulses for spatially localizing spectroscopic data. Three different pairs of 90 degree RF pulses are applied during the application of three different gradient pulses to excite and dephase unwanted volumes. A selected volume of interest (VOI) now contains unexcited and non-dephased spins. A 90 degree RF pulse is applied to excite the spins in the selected VOI and signals are acquired from the selected VOI.

22 Claims, 2 Drawing Sheets

MAGNETIC RESONANCE SPECTROSCOPY STUDIES OF RESTRICTED VOLUMES

FIELD OF THE INVENTION

This invention relates to magnetic resonance spectroscopy (MRS) and, more particularly, to methods for spatially restricting volume of interest for MRS studies. Related applications and prior art are listed in application entitled "Magnetic Resonance of Restricted Volumes" which was filed in Israel on March 27, 1987 and received Ser. No. 82029. A corresponding application was filed in the United States on March 24, 1988, and received Ser. No. 172,398. The inventor and the assignee are the same as listed herein.

BACKGROUND OF THE INVENTION

While nuclear magnetic resonance (NMR) chemical shift spectroscopy has been used for a long time, it is only relatively recently that magnetic resonance spectroscopy (MRS) has included means for localization of the volume from which the signal is received. The localization of the spectroscopic signals facilitates coordinating the MRS with magnetic resonance imaging (MRI) studies. This coordination and combination of studies related to specific volumes of interest enables obtaining a maximum of factual data from particular volumes of a patient thereby enhancing the ability to use the data for diagnostic purposes.

As is well known MRS is similar to MRI in that a relatively strong static magnetic field that has a given direction which is aligned with the Z axis of a cartesian coordinate system, is used. The strong static magnetic field causes the nuclei of certain elements or "spins" to align with and precess about the field. Subsequently radio frequency (RF) pulses of sufficient amplitude and time duration are applied to tip the aligned spins into a transverse plane. The rotational frequency of the RF precession and the frequency of the RF pulse is known as the Larmor frequency which is given by the equation:

$$F = \gamma B_o / 2\pi$$

where:

$\gamma$ is the gyromagnetic ratio, constant for each isotope which exhibits a net magnetic moment;

$B_o$ is the magnetic field strength; and $\pi$ is the well known constant 3.1416+

After termination of the RF pulse the rotated spins precess in the transverse plane and also tend to realign with the static magnetic field. The precession of the transverse component in the magnetic field generates transient RF signals also having a Lamor frequency. These signals are known as free induction decay (FID) signals. It is these signals that are used to provide information that is used for spectroscopy and for imaging purposes.

It has been recognised in the prior art that the full potential of NMR spectroscopy in clinical diagnostic applications or in biological in vivo research necessitates the accurate localization of a volume of interest (VOI) within the subject. Without this localization, a meaningful interpretation of MRI signals from a heterogeneous sample is not possible as the signals that originate outside the volume of interest (VOI) would remain undistinguished and would mix with the signals that are meaningful. Thus, it is necessary to discriminate between signals originating within the VOI and signals originating outside the VOI for meaningful spectroscopic data aquisition.

Many different methods for spatial localization of MRI signals are known. Among the methods presently in vogue are the use of surface coils and "depth" pulses. See for example, the articles by M. R. Bendall et al in the Journal of Magnetic Resonance, Vol. 67, p494 (1985) and the article by T. C. Ng et al in Magnetic Resonance Medicine, Vol. 1, p450 (1984). Other methods use:

(1) "static profile gradients", see for example, the article by R. Damadian et al in Science, Vol. 194, p30 (1976);

(2) time dependant gradients, see for example, the article by K. N. Scott et al in the Journal of Magnetic Resonance, Vol. 50, 339 (1982);

(3) static linear gradients in conjunction with selective RF pulses, see for example, the article by R. E. Gordon et al in the Procedings of the Third Annual Meeting of the Society of Magnetic Resonance in Medicine, N.Y. p272, (1984) and the article by W. P. Aue et al in the Journal of Magnetic Resonance, Vol. 56, p350 (1984).

In addition there is a method of selecting the volume of excitation using stimulated echoes written by the inventor herein which appeared in the Journal of Magnetic Resonance, Vol. 70, p488–492 (1986).

Frequency modulated radio frequency pulses have been used in MR imaging experiments as shown, among other places, in an article by D. Kunz which appeared in Magnetic Resonance in Medicine, Vol. 3, pp377–384 (1986).

A more specific explanation of the use of modulated radio frequency pulses and stimulated echo for MRI experiments was covered in an article in Magnetic Resonance in Medicine, Vol. 4, pp129–136 (1987) also by D. Kunz.

Nowhere in the prior art, however, is there any article or teaching of use of frequency modulated RF pulses for spatially localizing spectroscopy data.

Among the problems of the prior art in localization of data obtained for MR spectroscopy are the adverse effects of eddy currents. In the prior art saturation methods are often used in an attempt to minimize the eddy current problems where spins in volumes outside the VOI are saturated and the VOI are left unsaturated.

Another method used by the prior art to overcome the adverse effects of eddy current caused by the high gradient pulses is the use of a sin sinc shaped radio frequency pulse. See for example, the article by D. M. Doddrell et al which appeared in the Journal of Magnetic Resonance, Vol. 70, pp319–326 (1986). However, with both the saturation method and the sin sinc shaped RF pulses, the definition of volume is not good. Also, with the saturation method large volumes have to be saturated, therefore, a large number of saturation pulses are required and because of this, there is a tendency towards a T1 time dependancy, Furthermore, this also increases the RF power depositions in the subject or patient under MRS study. Therefore, the saturation method is not useful under certain circumstances.

Accordingly, there is a need for improved MRS spatial localization methods in obtaining spectroscopic data.

According to a broad aspect of the invention, a magnetic resonant spectroscopic method for accurate localization of a VOI within the subject is provided, said method comprising the steps of:

applying a first set of two 90 degree RF pulses during the application of a first gradient pulse to excite and dephase various unwanted regions in a first direction, applying a second set of two 90 degree RF pulses during the application of a second gradient pulse to excite and dephase different unwanted regions in a second direction, applying a third set of two 90 degree RF pulses during the application of a third gradient pulse to excite and dephase different unwanted regions in a third direction, whereby only selected VOI's contain unexcited non-dephased spins, applying a 90 degree RF excitation pulse to excite spins in said selected VOI's, and acquiring FID signals from said selected VOI's.

According to a feature of the invention, said sets of 90 degree RF pulses are sets of frequency modulated 90 degree RF pulses.

According to yet another feature of the present invention the last excitation pulse is also a frequency modulated pulse. However, in accordance with the invention the last excitation pulse may be an amplitude modulated pulse.

According to yet another feature of the present invention there is a delay time between the last set of 90 degree RF pulses and the last 90 degree RF pulse.

According to yet another feature of the present invention means are provided for overcoming the eddy current effects and for providing volumes of interest that have efficiently and effectively defined boundaries and are not plagued by T2 or T1 time dependencies and therefore, are useful for collecting data even when the time period T2 is especially short.

A further related feature of the invention is the provision of obtaining more clearly defined limits on the VOI for the same bandwidth. Furthermore, with the present invention the number of saturation pulses required for defining the VOI are cut in half.

The present invention provides for low power deposition, reduces the T1 dependancy and provides a reduced peak power compared to amplitude modulation spatial localization methods for MRI.

BRIEF DESCRIPTION OF THE DRAWINGS

The above mentioned and other features and objects of the present invention will become more readily apparent when the invention is considered in the light of the following description made in conjunction with the accompanying drawings; wherein.

GENERAL DESCRIPTION

Figure 1:
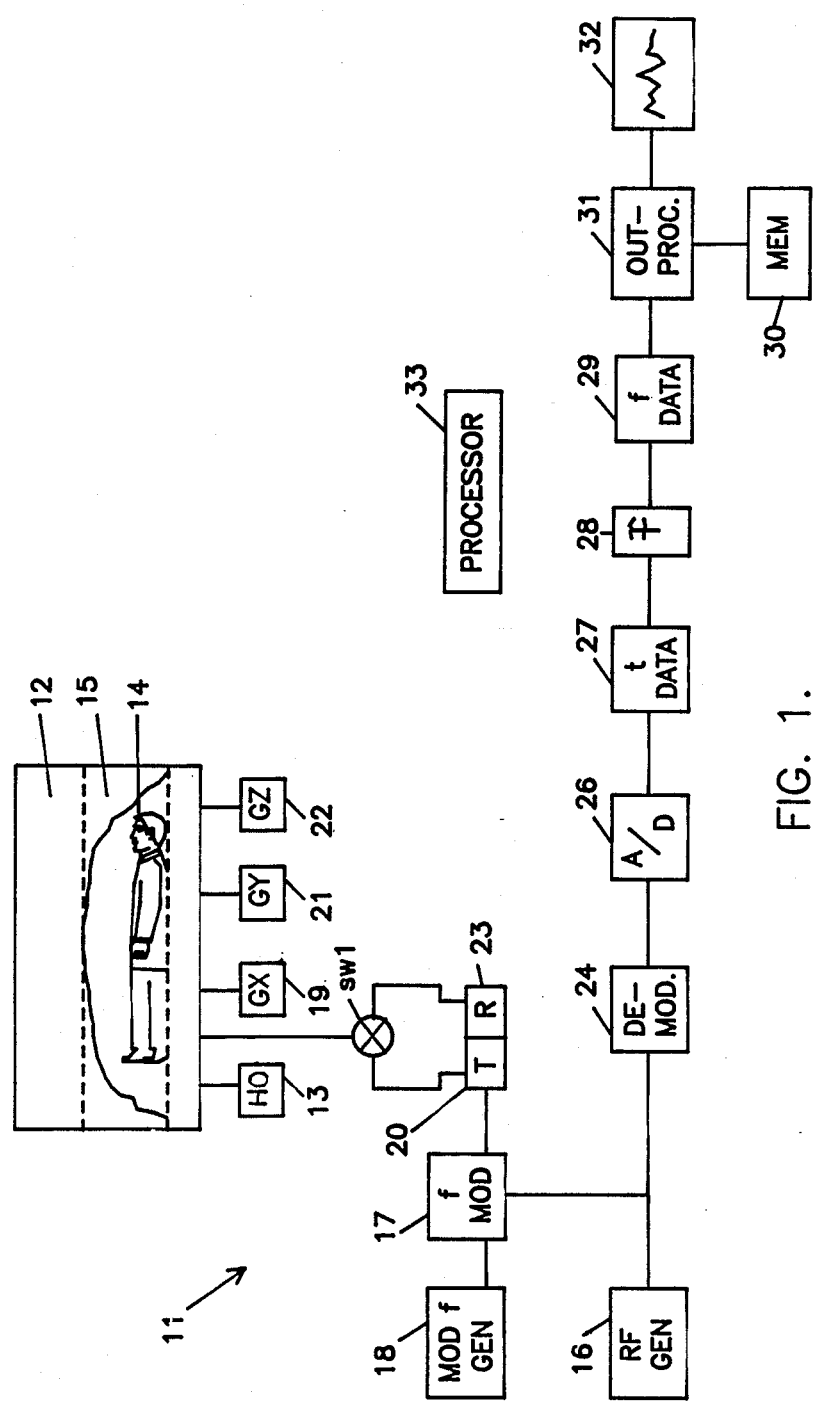
FIG. 1 is a block diagram of an inventive MRS system.

FIG. 1 at 11 shows in block diagram for an in vivo magnetic resonance data acquisition system particularly useful for acquiring spectroscopic data. The system includes a magnet 12 for generating a large static magnetic field. The magnet is sufficiently large to have a bore 15 into which a patient 14 can fit. The magnetic field is generated by a magnetic field generator Ho indicated at 13.

RF magnetic pulses are generated utilizing RF generator 16. The pulses are frequency modulated using frequency modulator 17. While the shape of the pulse can follow any design in this frequency modulated system, in FIG. 2 the pulses are schematically indicated by rectangular shapes. A modulation frequency generator 18 provides the frequency input to modulator 17 for preferably linearly frequency modulating the RF frequency provided by generator 16. The frequency modulated RF pulses are transmitted to coils used within the magnet which are not shown. The coils could be body coils, surface coils, limb coils or head coils within the scope of this invention.

The RF pulses are applied in the presence of gradients such as X, Y or Z gradients generated by gradient generators 19, 21 and 22 respectively.

According to the invention, the first frequency modulated set of frequency modulated RF pulses (see FIG. 2) are shown as pulses P1 and P2, the RF pulses are applied in the presence of gradient G1 which could be an X, Y or Z gradient generated by the generators 19, 21 or 22 respectively shown in FIG. 1.

According to the invention the first RF pulses P1 and P2 are 90 degree pulses. They are applied in the presence of the gradient and they tend to excite the spins which are dephased by the gradients. The frequencies of pulses P1 and P2 are applied in in combination with the gradient GX for example. The spins in a selected portion of the patient in the X direction are excited and dephased. As a matter of fact only a selected area is left unaffected. Similarly, with the application of pulses P3 and P4 which make up the second set of RF pulses applied in the presence of the second gradient, which in a preferred embodiment is a Y gradient, excites spins which are then dephased so as to leave only a selected volume along the Y direction unaffected. Finally, radio frequency pulses P6 and P7 which are frequency modulated are applied during the application of a Z gradient to excite and dephase all but selected spins in a volume along the axis in the Z direction.

Dephasing of the transverse magnetization following each set of RF pulses is achieved by continuing the application of each selection gradient past the RF pulses. Further, additional "spoiler" gradient pulses shown, for example, as pulses S1-S6, are applied following each set of RF pulses, along the axes perpendicular to the slice selection gradient.

Figure 2:
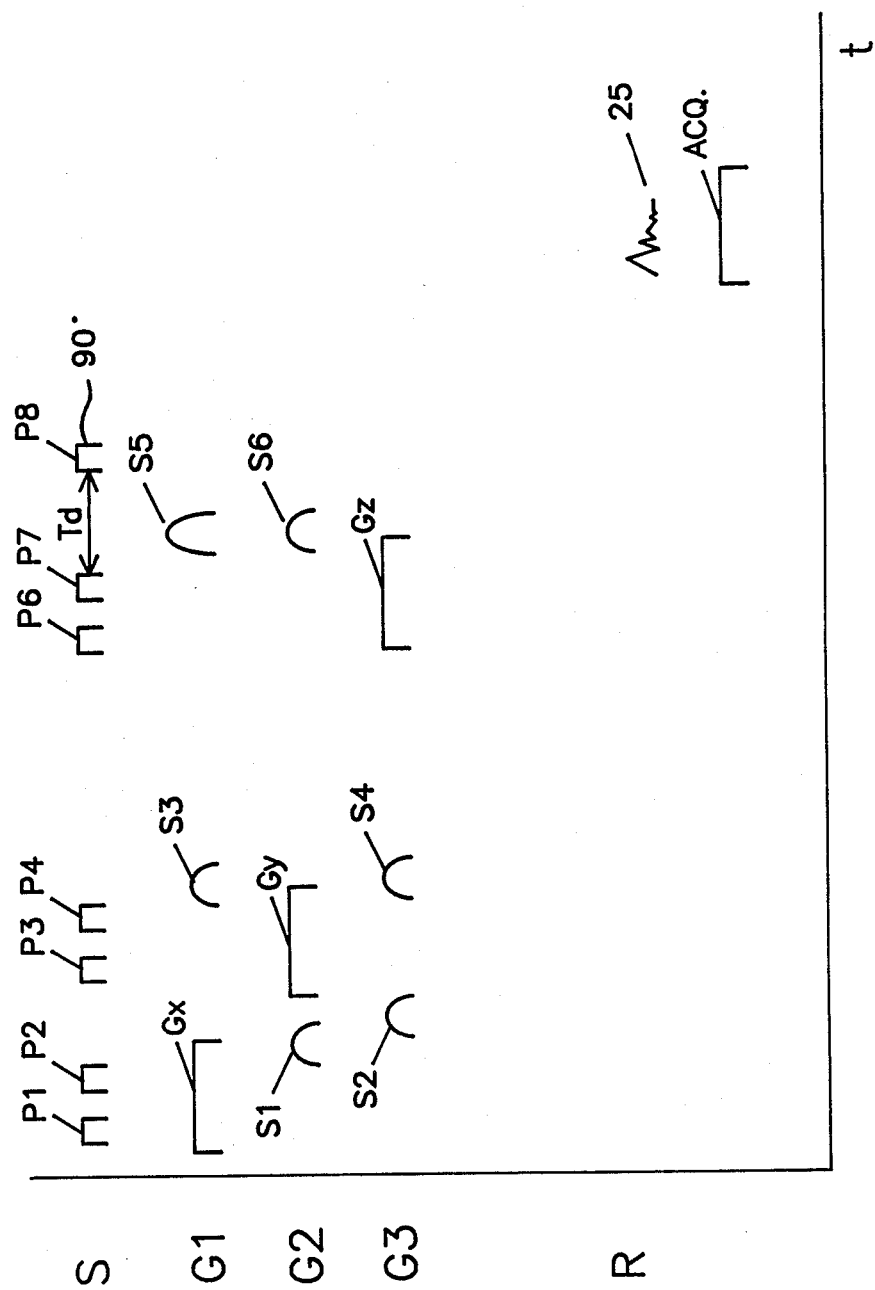
FIG. 2 is a schematic depiction of an inventive scan sequence using the equipment of FIG. 1.

Preferably after a time delay, which may be variable, shown as Td, a 90 degree pulse P8 is applied without a gradient to effect all of the spins in the subject within the range of the surface coil being used for applying and detecting the RF pulses and RF signals. The last 90 degree pulse can only affect the volume which is defined by the intersection of the three volumes left unaffected by the prior application of the frequency modulated RF pulse sets. In a preferred embodiment the selection excitation pulse P8 is also a frequency modulated RF pulse. The application of pulse P8 results in an FID shown at 25 in FIG. 2 which is the spectroscopic signal as received from the volume of interest selected in accordance with the sequence of FIG. 2. The received signal 25 shown in FIG. 2 is detected by receiver coils in the magnet which are not shown. The receiver coil and the transmitter coil may be the same.

In either case a switch SW1 determines the mode (receiving or transmitting) of the system. When switch SW1 is in the receiving mode, then the signal is received by receiver 23. From receiver 23 the signal is connected to the demodulator 24. The demodulator 24 is also connected to the radio frequency generator to provide the frequency used in the demodulating process of the signal received from the receiver 23. The output of the demodulator is sent through an analog to digital convertor unit 26. The digital data 27 is then operated on by a Fourier operator shown at 28 to convert the time data 27 at the output of unit 26 to frequency data 29. The frequency data 29 is the spectroscopic trace of the resonance lines received from the system. It is connected to the spectrum processors in this case, for providing the spectroscopic graph or chemical shift graph indicated at 32. The spectrum processor 31 preferably has memory means 33 attached thereto for recording the graph of amplitude vs frequency showing the resonant lines.

The system is used in the sequence of FIG. 2 to provide excellent spectroscopic data that is localized to particular volumes of interest without adverse eddy current effects and with a fine definition of the volume. The power deposition is low because even though there are wider band widths using the frequency modulated gradient pulses; nonetheless since, fewer RF pulses are used the power deposition is reduced. The power usage in this described frequency modulated system compared to the power usage in amplitude modulation system assures a more efficient system. The system as described herein can operate with short sequences therefore the system substantially reduces the T1 dependancy. The delay time Td is varied as required to reduce eddy current effects. Also, the size and location of the VOI can be varied by varying the bandwidths and/or offset frequencies of the pulses and/or the strength of the selection gradients.

While the foregoing invention has been described using preferred embodiments, it should be understood that the preferred embodiments are shown by way of example only and not as limitations on the scope of the invention; which scope is defined by the accompanying claims.

What is claimed is:

1. A magnetic resonance spectroscopic (MRS) method for accurately locating a region of interest within a subject, said method comprising the steps of:
   applying a first set of two 90° RF pulses during the application of a first gradient pulse of substantially constant value to saturate with each pulse of said first set of two 90° RF pulses a different unwanted region in a first direction leaving as a first unsaturated region in said first direction a region unaffected by either of said first set of two 90° RF pulses,
   applying a second set of two 90° RF pulses during the application of a second gradient pulse of substantially constant value to saturate with each pulse of said second set of two 90° RF pulses a different unwanted region in a second direction leaving as a second unsaturated region in said second direction a region unaffected by either of said second set of two 90° RF pulses such that only a selected region of interest at the intersections of said first and said second unsaturated regions contains unsaturated spins,
   applying a 90° excitation pulse to excite said unsaturated spins in said selected region of interest, and
   acquiring FID signals from said selected region of interest.

2. A magnetic resonance spectroscopic (MRS) method for accurately locating a volume of interest (VOI) within a subject, said method comprising the steps of:
   applying a first set of two 90° RF pulses during the application of a first gradient pulse of substantially constant value to saturate with each pulse of said first set of two 90° RF pulses a different unwanted region in a first direction leaving as a first unsaturated region in said first direction a region unaffected by either pulse of said first set of two 90° RF pulses,
   applying a second set of two 90° RF pulses during the application of a second gradient pulse of substantially constant value to saturate with each pulse of said second set of two 90° RF pulses a different unwanted region in a second direction leaving as a second unsaturated region in said second direction a region unaffected by either pulse of said second set of two 90° RF pulses,
   applying a third set of two 90° RF pulses during the application of a third gradient pulse of substantially constant value to saturate with each pulse of said third set of two 90° RF pulses a different unwanted region in a third direction leaving as a third unsaturated region in said third direction a region unaffected by either pulse of said third set of two 90° RF pulses such that only a selected VOI at the intersection of said first, second and third unsaturated regions contains unsaturated spins,
   applying a 90° excitation pulse to excite said unsaturated spins, and
   acquiring FID signals from said excited spins in said selected VOI.

3. A magnetic resonance spectroscopic (MRS) system for accurately locating a region of interest (ROI) within a subject, said system comprising:
   means for applying a first set of two 90° RF pulses during the application of a first gradient pulse of one plurality to saturate a different unwanted region for each of said two 90° RF pulses in a first direction leaving a first unsaturated region in said first direction,
   means for applying a second set of two 90° RF pulses during the application of a second gradient pulse of one plurality to saturate a different unwanted region for each of said two 90° RF pulses of said second set in a second direction leaving a second unsaturated region in said second direction, such that only a selected ROI at the intersection of said first and said second unsaturated regions contains unsaturated spins,
   means for applying a 90° excitation pulse to excite said unsaturated spins, and
   means for acquiring FID signals from said selected ROI.

4. A magnetic resonance spectroscopic (MRS) system for accurately locating a volume of interest (VOI) within a subject, said system comprising:
   means for applying a first set of two 90° RF pulses during the application of a first gradient pulse of one plurality to saturate a different unwanted region for each of said two 90° RF pulses of said first set in a first direction,
   means for applying a second set of two 90° RF pulses during the application of a second gradient pulse of one plurality to saturate a different unwanted region for each of said two 90° RF pulses of said second set of two 90° RF pulses in a second direction leaving a second unsaturated region along said second direction, means for applying a third set of two 90° RF pulses during the application of a third gradient pulse of one plurality to saturate yet a different unwanted region for each of said two 90° RF pulses of said third set along a third direction leaving a third unsaturated region along said third direction such that only a selected VOI at the intersection of said first, second and third unsaturated regions contains unsaturated spins, means for applying a 90° excitation pulse to excite said unsaturated spins, and means for acquiring FID signals from said selected VOI.

5. The method of claims 1 or 2 including using RF frequency modulated radio frequency pulses as the pulses of said sets of 90 degree RF pulses.

6. The method of claims 1 or 2 wherein said VOI 90 degree excitation RF pulse is a frequency modulated RF pulse.

7. The method of claim 1 including a delay between said last set of RF pulses and said VOI 90 degree excitation RF pulse.

8. The method of claim 5 and applying a delay between said last set of RF pulses and said last VOI 90 degree excitation RF pulse.

9. The method of claim 5 and the steps of using a frequency modulated radio frequency pulse as the last 90 degree excitation RF pulse.

10. The method of claim 5 and the step of applying a delay between the last set of RF pulses and said last 90 degree excitation RF pulse.

11. The method of claim 6 and the step of applying a delay between said last set of RF pulses and said last 90 degree excitation pulse.

12. The method of claim 7 wherein said delay is variable.

13. The method of claims 1 or 2 including the step of applying spoiler gradient pulses following at least one set of said RF pulses to saturate spins in the direction of said at least one set.

14. The system of claim 3 or 4 wherein sets of 90 degree RF pulses are frequency modulated.

15. The system of claim 3 or 4 wherein said VOI 90 degree excitation RF pulse is a frequency modulated RF pulse.

16. The system of claim 4 including a delay between said last set of RF pulses and said VOI 90 degree excitation RF pulse.

17. The system of claim 14 and means for applying a delay between said last set of RF pulses and said last VOI 90 degree excitation RF pulse.

18. The system of claim 14 including means for a frequency modulating the last 90 degree excitation RF pulse.

19. The system of claim 14 and means for applying a delay between the last set of RF pulses and said last VOI 90° degree excitation RF pulse.

20. The system of claim 15 and means for applying a delay between said last set and said last VOI 90 degree excitation pulse.

21. The system of claim 16 including means for varying the delay.

22. The system of claims 3 or 4 including means for applying spoiler gradient pulses following at least one of said sets of RF pulses to saturate tipped spins in the direction of said at least one of said sets of RF pulses.

* * * * *